United States Patent [19]

Masdea et al.

[11] Patent Number: 4,721,924
[45] Date of Patent: Jan. 26, 1988

[54] DEVICE FOR TUNING A VCO TO THE CARRIER FREQUENCY OF EACH RADAR PULSE

[75] Inventors: Arturo Masdea, Pomezia; Pietro Bartolini, Rome; Gianfranco Colavito, Rome; Filippo Neri, Rome, all of Italy

[73] Assignee: Selenia Industrie Elettroniche Associate S.p.A., Rome, Italy

[21] Appl. No.: 852,955

[22] PCT Filed: Jul. 3, 1985

[86] PCT No.: PCT/IT85/00014
§ 371 Date: May 12, 1986
§ 102(e) Date: May 12, 1986

[87] PCT Pub. No.: WO86/00768
PCT Pub. Date: Jan. 30, 1986

[51] Int. Cl.⁴ ............................................. H03L 7/06
[52] U.S. Cl. ................................ 331/1 R; 331/14; 331/15; 331/17; 342/13; 455/1
[58] Field of Search .................... 331/14, 22, 23, 1 R, 331/15, 17, 25; 342/13–15; 455/1

[56] References Cited

U.S. PATENT DOCUMENTS

| 3,794,771 | 2/1974 | Darboven et al. | 329/122 |
| 4,061,979 | 12/1977 | Walker et al. | 331/17 X |
| 4,101,844 | 7/1978 | Malone | 331/17 X |
| 4,600,889 | 7/1986 | Rugen | 331/17 X |
| 4,651,104 | 3/1987 | Miyo | 331/1 R X |

FOREIGN PATENT DOCUMENTS 1257554 5/1960 France.
8101616 6/1981 PCT Int'l Appl.

Primary Examiner—Eugene R. LaRoche
Assistant Examiner—David Mis
Attorney, Agent, or Firm—Stiefel, Gross, Kurland & Pavane

[57] ABSTRACT

An electronic device for rapidly tuning a voltage controlled oscillator to the radar carrier frequency of each of the individual radar pulses. A frequency discriminator (1) of the quadricorrelator type is supplied with the incoming pulses and with the output of the VCO (5) to provide the control voltage to the VCO (5) via amplifying stages (2), (4) and a sample-and-hold circuit (3) that maintains the tuned frequency for time durations greater than 100 usec. The operating frequency range of the device is between 6GHz–18GHz.

5 Claims, 2 Drawing Figures

DEVICE FOR TUNING A VCO TO THE CARRIER FREQUENCY OF EACH RADAR PULSE

BACKGROUND OF THE INVENTION

The present invention relates to an electronic device which can tune a voltage controlled oscillator (VCO) carrier frequency, pulse to pulse, to the carrier frequency of a radar pulse, operating over bands beyond one octave.

Such device can compensate for frequency errors up to ±500 MHz in a time period shorter than 100 μsec. As the device is equipped with a memory circuit, signal lock may be maintained for the time sufficient to allow to any type of intentional interference.

The invention belongs to the radar field, and more exactly, to the field of "frequency tuning devices". It finds specific application in the field of Electronic Counter Measures. Here, the function of such devices is to effect in the shortest possible time, VCO tuning to the radar pulse carrier frequency. This way, further modulation of the VCO around such carrier, by means of noise or interference, may mask the radar return echo so as to deprive it of presence information in the case of surveillance and of tracking radars. At present, tuning problems are solved, in general, through devices such as:

PLL (Phase locked loop)
AFC (Automatic Frequency Control)

The PLL uses a phase detector as a comparator between input signal and VCO phase. This phase difference at the phase detector (PD) output is converted into a difference of potential, which applied to the VCO, changes its frequency in a way to reduce the initial phase error.

The AFC is based upon a frequency discriminator which may be of two types:

Intermediate frequency discriminator
Interferometric frequency discriminator

In the case of the IF discriminator, two resonant circuits tuned to frequencies symmetrical to a prefixed reference frequency are used; resonance curves, one of which inverted, (if the detected signal difference is calculated) give way to the typical S voltage-frequency curve of the discriminator, the null point of which coincides with the prefixed reference frequency.

In the case of the interferometric discriminator the input signal is split into two branches, one of which reaches a phase detector directly, while the other one reaches destination via a delay line.

The phase detector output is a voltage proportional to the phase between the two signals. This phase difference, in turn, is proportional to the input signal frequency.

The voltage proportional to the frequency difference, sent to the VCO, is such that through the AFC loop, the frequency received and that of the VCO are made to coincide.

In a tuning system using the PLL principle, there is a tight relation between lock-in band and loop band.

This means that when a lock-in band of a few hundred MHz is required, one PLL alone does not solve the problem adequately for obvious physical reasons relating to component bandwidth.

In a tuning system using the AFC principle, lock in time is related to the loop bandwidth, and the maximum Δf for which the loop can lock is exclusively set by the frequency discriminator characteristics. It is a well known fact that an IF type frequency discriminator has a limited lock in range (tens of MHz) while an interferometric discriminator, which gives way to wider lock in ranges, has the drawback of large deviations from linearity, as well as noise and dynamics problems. Furthermore lock-in times are longer and the loop is not suitable for ultrarapid tuning.

In any case these discriminators, working at fixed reference frequencies, do not give fast lock in because the frequency measurement, onto which lock in has to take place, and that of VCO, must be made on the same discriminating element at different times.

SUMMARY OF THE INVENTION

Objects of the present invention are to:
1. provide a discriminator/tuning circuit which can tune, pulse to pulse, the VCO frequency line to the radar pulse carrier frequency;
2. correct errors greater than ±500 MHz within a time period not greater than 100 nsec;
3. keep radar signal lock for the time sufficient to enable any type of intentional interference, such as >100 μsec, by means of a memory circuit inside the loop.

BRIEF DESCRIPTION OF THE DRAWINGS

To facilitate further discussion of the present invention, the following drawings are provided in which.

DETAILED DESCRIPTION OF THE INVENTION

Figure 1:
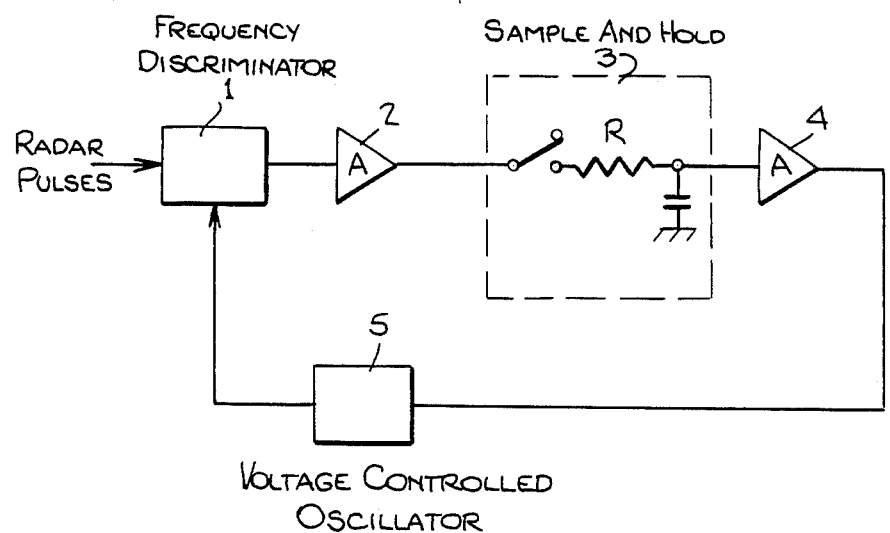
FIG. 1 shows a block diagram of one embodiment of the invention.

The figures may be described in further detail as follows. FIG. 1 shows a block diagram of the device, where the elements listed below have the indicated reference numerals:

a frequency discriminator (1)
two video amplifier stages (2) (4)
a Sample & Hold sampling and memorizing circuit (3)
a Voltage Controlled Oscillator (5).

Figure 2:
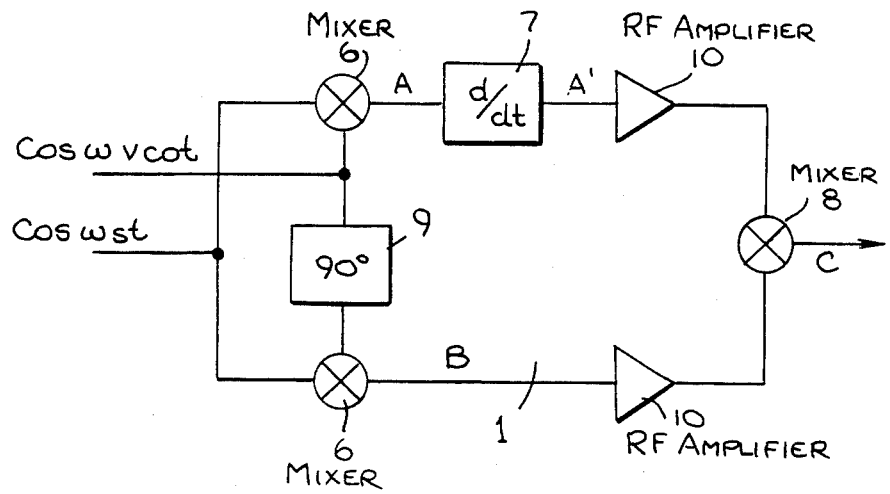
FIG. 2 shows a block diagram of one embodiment of the internal structure of the frequency discriminator of FIG. 1.

FIG. 2 shows the frequency discriminator circuit block diagram shown as (1) in FIG. 1. It is made up of:

three mixers (6) (8)
a differentiator circuit (7)
a 90° hybrid (9)
two RF amplifiers (10).

As can be seen from the figures, the radar signal, arriving from a possible threat (missile en route), arrives at the frequency discriminator (1) and a d.c. term appears at its output which is proportional to the input frequency difference (coming one from the VCO/5 performing voltage to frequency conversion, the other from the radar) with their sign, and a frequency term twice that of the frequency difference, which varies with a cosine law.

The term useful for the loop is the d.c. one, corresponding to the radar pulse.

The two video amplifier stages (2) and (4), doubled for dynamic reasons, serve to fix the correct gain value of the loop to enable lock-in from a prefixed initial Δf with the accuracy desired.

A S/H circuit (Sample and Hold or memory circuit (3)) maintains, for some time, the VCO line (5) onto that of the signal once the tuning phase is over.

VCO (5) varies its frequency rapidly (30 nsec) as the output voltage from the discriminator (1) changes.

With reference to FIG. 2 and calling $f_S$ and $f_{VCO}$, respectively, the input signal frequency (belonging to a given threat such as a missile en route) and that of the VCO, the following signals will be present at points A, B and C:

$$A = \cos \omega_S t \cos \omega_{VCO} \simeq \frac{1}{2} \cos (\omega_S - \omega_{VCO}) t \quad (1)$$

In (1) the sum frequency term has been neglected as such term either falls outside the operational band or is about 20 dB below the difference frequency term.

(Such assumption holds true for all the sum frequency terms.) For the same reason, low pass filters at the output of (6) have not been used.

$$A^1 = --(\omega_S - \omega_{VCO}) \sin (\omega_S - \omega_{VCO}) t = \quad (2)$$
$$\frac{1}{2} (\omega_S - \omega_{VCO}) \sin (\omega_{VCO} - \omega_S) t$$

It is worth noting that the differentiator makes use of an RC structure using a very low loss, high precision capacitor chip mounted onto a 50 ohm line manufactured on an alumina substrate ($Al_2O_3$).

As the capacitor is precision made so that the electrodes are effectively two parallel planes having uniform thickness and dimensions contained within the defined tolerances, precisions on the capacity value of the order of $\pm 0.01$ pF are obtained.

The manufacturing tolerances and the very low loss dielectric are such that inductive and resonant phenomena are negligible, so that the capacitor manufactured continues to behave as an ideal capacitor even at extremely high frequencies.

The fixing of the device into the substrate is achieved through thermal compression taking care to minimize terminal length to reduce all parasitic effects.

$$B = \sin \omega_{vco} t \cdot \cos \omega_s t \simeq \frac{1}{2} \sin (\omega_{vco} - \omega_s) t \quad (3)$$

$$C = \frac{1}{4} (\omega_s - \omega_{vco}) \sin^2 (\omega_{vco} - \omega_s) t = \frac{1}{8} (\omega_s - \omega_{vco}) 1 - \quad (4)$$
$$\cos 2 \cdot (\omega_{vco} - \omega_s) t = \frac{1}{8} (\omega_s - \omega_{vco}) -$$
$$\frac{1}{8} (\omega_s - \omega_{vco}) \cos 2 \cdot (\omega_s - \omega_{vco}) t$$

From the last relation it can be seen that the output of the FIG. 2 circuit produces a continuous term which is proportional to the frequency difference in sign and to a frequency term which depends on twice the difference frequency, which varies with a cosine profile. The d.c. term is the useful one in terms of loop performance, while the cosine term, for high $\Delta f$ durations, is averaged or filtered by the loop and for $\Delta f_S$ within the loop band, it modulates the VCO in an irrelevant manner.

As in an AFC loop the following holds true:

$$t = \frac{1}{\omega_n} \quad (5)$$

where:

$\omega_n$ is the closed loop band and t is the lock-in time. To achieve extremely short lock-in times it is necessary to insert into the loop a filter such that through a suitable loop gain, the closed loop gain fits relation (5) with $t < 100$ nsec.

To this end the sample/hold (3) time constant is exploited, whereby it is dimensioned to achieve the desired closed loop cutoff frequency.

The video amplifiers, twin for dynamics reasons, are such that with discriminator kd and VCO $K_V$ the correct open loop gain is achieved to obtain the desired performance.

The device of this invention utilizes, in an original manner, a quadri correlator as a frequency discriminator in a RF tuning loop. Normal RF mixers are used, obtainable on the market and no recourse is made to delay lines as in present interferometric discriminators. This allows a very wide operational bandwidth of the device, which is limited exclusively by the present microwave components. A peculiarity of this discriminator is the characteristic voltage frequency S curve which does not have its null at a prefixed frequency, but, rather, presents its null always correspondingly to the frequency of the subject signal over the whole working band.

The assembly achieves in simple manner absolutely outstanding performance, which similar configurations have never achieved:

| | |
|---|---|
| loop operational bandwidth | >1 octave eg 6.5:18 GHz |
| lock in band | >±500 MHz |
| lock in time | <100 nsec |
| frequency error starting from maximum deviation | <5 MHz |
| AFC loop bandwidth | >2.5 MHz |

The device of the present invention, is particularly useful for those operational situations where fast switching of a radar signal is required. Furthermore, due to its high performance, including very fast lock in time, it is suitable for inclusion in systems for agile and coded radars interference which are to date immune to electronic warfare equipment.

We claim:

1. A device for rapidly tuning the frequency of a voltage controlled oscillator to the carrier frequency of each pulse of a radar, comprising:
    a frequency discriminator having two inputs and adapted to receive radar pulses directly to one of the two inputs;
    a first amplifier coupled to the output of the frequency discriminator;
    a sample-and-hold circuit coupled to the output of the first amplifier;
    a second amplifier coupled to the output of the sample-and-hold circuit; and
    a voltage controlled oscillator coupled to the output of the second amplifier, the output of which voltage controlled oscillator is in turn coupled to the second input of the frequency discriminator.

2. The device of claim 1 in which the frequency discriminator is comprised of at least two input mixers, a 90° hybrid coupled to one input of each of the input mixers, a differentiator coupled to the output of one of the mixers, at least two amplifiers, and an output mixer, such that a direct current term is generated at the output of the output mixer which is proportional to the difference frequency in sign and to a frequency term which is twice the frequency difference and varies as the cosine of the input.

3. The device of claim 2 in which the frequency discriminator operates as a quadricorrelator in an R.F. tuning loop.

4. The device of claim 3 having an operating frequency range of 6GHZ-18GHz.

5. The device of claim 4 which maintains the tuned frequency of the voltage controlled oscillator for time durations greater than 100 microseconds.

* * * * *